US011105835B2

(12) United States Patent
Schramme et al.

(10) Patent No.: US 11,105,835 B2
(45) Date of Patent: Aug. 31, 2021

(54) METHOD FOR OPERATING A CURRENT SENSOR AND CURRENT SENSOR

(71) Applicant: Continental Automotive GmbH, Hannover (DE)

(72) Inventors: Martin Schramme, Königsbrunn (DE); Martin Geiger, Böbrach (DE)

(73) Assignee: CONTINENTAL AUTOMOTIVE GMBH, Hannover (DE)

( * ) Notice: Subject to any disclaimer, the term of this patent is extended or adjusted under 35 U.S.C. 154(b) by 50 days.

(21) Appl. No.: 16/600,893

(22) Filed: Oct. 14, 2019

(65) Prior Publication Data
US 2020/0116764 A1 Apr. 16, 2020

(30) Foreign Application Priority Data
Oct. 15, 2018 (DE) ..................... 10 2018 217 605.1

(51) Int. Cl.
*G01R 31/382* (2019.01)
*G01R 19/00* (2006.01)
(Continued)

(52) U.S. Cl.
CPC ......... *G01R 19/0092* (2013.01); *G01R 1/203* (2013.01); *G01R 31/382* (2019.01); *G01R 35/005* (2013.01)

(58) Field of Classification Search
CPC ............. G01R 19/0092; G01R 31/382; G01R 31/006; G01R 31/364
See application file for complete search history.

(56) References Cited

U.S. PATENT DOCUMENTS

2009/0289639 A1* 11/2009 Kawamura .......... G01R 31/086
324/658
2010/0225304 A1* 9/2010 Wynne ................... G01R 15/04
324/126
(Continued)

FOREIGN PATENT DOCUMENTS

DE 102016202500 A1 8/2017
DE 102017203535 A1 9/2018
(Continued)

OTHER PUBLICATIONS

German Search Report for German Application No. 10 2019 215 754.8, dated Jun. 18, 2020, with partial English translation, 7 pages.
(Continued)

Primary Examiner — Dominic E Hawkins
(74) Attorney, Agent, or Firm — RatnerPrestia

(57) ABSTRACT

A method for operating a current sensor, having a first measurement resistor, a second measurement resistor and a reference resistor. The first and second measurement resistors are arranged in series. The reference resistor is electrically disconnected from the first and second measurement resistors in a first measurement state and connected in parallel with the first measurement resistor in a second measurement state. In the first measurement state, identifying the respective first and second measurement resistors voltage drop and determining the ratio of the voltage drops. In the second measurement state, identifying the respective first and second measurement resistors voltage drop and the reference resistor voltage drop, and determining the electrical resistance of the first and second measurement resistors from the identified voltage drops, the electrical resistance of the reference resistor and the ratio of the voltage drops of the first and second measurement resistors determined in the first measurement state.

14 Claims, 2 Drawing Sheets

(51) Int. Cl.
*G01R 1/20* (2006.01)
*G01R 35/00* (2006.01)

(56) References Cited

U.S. PATENT DOCUMENTS

| | | | |
|---|---|---|---|
| 2015/0323607 A1* | 11/2015 | Rink | G01R 19/0092 |
| | | | 324/426 |
| 2016/0047852 A1* | 2/2016 | Poisson | G01R 17/12 |
| | | | 324/522 |
| 2016/0054745 A1* | 2/2016 | Sawyers | G05F 1/46 |
| | | | 324/71.1 |
| 2019/0011504 A1* | 1/2019 | Kim | G01R 27/025 |
| 2020/0011905 A1 | 1/2020 | Schramme et al. | |

FOREIGN PATENT DOCUMENTS

| | | |
|---|---|---|
| DE | 102017219016 A1 | 4/2019 |
| EP | 2546664 A2 | 1/2013 |
| WO | 2017140874 A1 | 8/2017 |

OTHER PUBLICATIONS

Extended European Search Report for European Application No. 19 202 988.2, dated Mar. 23, 2020, 6 pages.

\* cited by examiner

METHOD FOR OPERATING A CURRENT SENSOR AND CURRENT SENSOR

CROSS REFERENCE TO RELATED APPLICATIONS

This application claims priority to German Patent Application No. 10 2018 217 605.1, filed Oct. 15, 2018, the contents of such application being incorporated by reference herein.

FIELD OF THE INVENTION

The invention relates to a method for operating a current sensor and to a current sensor.

BACKGROUND OF THE INVENTION

In many applications, in particular in the vehicle sector, it is necessary to identify or to measure the currents arising in a very exact manner. The prior art discloses, for example, methods and sensors in which the current intensity is identified by means of the voltage drop across a measurement resistor arranged in the current path. For this purpose, it is necessary that the electrical resistance of the measurement resistor is known to a very accurate degree. In the vehicle sector, it is also necessary for the most exact possible measurement to be ensured over the entire lifetime of the vehicle or the sensor irrespective of the temperature or external influences.

Until now, specific alloys have therefore been used for the measurement resistor, for example a copper-nickel-manganese alloy, which exhibits both a small change in the electrical resistance over time and also a low sensitivity in the case of temperature changes.

However, these alloys are very expensive. Furthermore, the processing of these materials is very complex since they have to be connected to the material of the rest of the current sensor.

To improve the accuracy of current sensors having measurement resistors, in particular having measurement resistors exhibiting a greater temperature dependency or aging drift, the prior art discloses current sensors that are recalibrated continuously during operation. In the case of these current sensors, the electrical resistance of the measurement resistor or a correction value for the electrical resistance of the measurement resistor is determined over the entire lifetime of the current sensor in order to compensate for temperature-related or aging-related changes in the electrical resistance of the measurement resistor.

In a known method, a highly precise reference resistor is arranged in parallel with the measurement resistor and a portion of the load current is conducted temporarily across the reference resistor. The voltage drop at the measurement resistor decreases according to the branched-off current pulse. The magnitude of said current pulse is determined at the reference resistor. The electrical resistance of the measurement resistor or a correction value for the electrical resistance of the measurement resistor can be calculated from the ratio of the decrease in the voltage drop at the measurement resistor and the current pulse determined at the reference resistor.

SUMMARY OF THE INVENTION

To be able to determine the electrical resistance of the measurement resistor accurately, however, it is necessary for the most constant load current possible to be applied at the time of determination of the electrical resistance. If the load current changes before or while a portion of the load current is conducted across the reference resistor, this can influence the accuracy of the determination of the current pulse across the reference resistor and therefore the electrical resistance of the measurement resistor.

An aspect of the invention is a method for operating a current sensor that makes it possible to measure the load current more accurately. Another aspect of the invention is a current sensor that makes it possible to determine the load current more accurately.

An aspect of the invention is a method for operating a current sensor, which has a first measurement resistor, a second measurement resistor and also a reference resistor, wherein the first measurement resistor and the second measurement resistor are arranged in series between a first connection and a second connection of the current sensor, and wherein the reference resistor is electrically disconnected from the first measurement resistor and from the second measurement resistor in a first measurement state and the reference resistor is electrically connected in parallel with the first measurement resistor in a second measurement state. The method comprises the following steps:

a) in the first measurement state, identifying the voltage drop at the first measurement resistor and the voltage drop at the second measurement resistor and determining the ratio of the voltage drop at the first measurement resistor and the voltage drop at the second measurement resistor, b) in the second measurement state, identifying the voltage drop at the first measurement resistor, the voltage drop at the second measurement resistor and also the voltage drop at the reference resistor and determining the electrical resistance of the first measurement resistor and determining the electrical resistance of the second measurement resistor from the identified voltage drops, the electrical resistance of the reference resistor and the ratio of the voltage drops of the first measurement resistor and the second measurement resistor determined in the first measurement state.

In step a), the ratio of the electrical resistances of the first and of the second measurement resistor is first identified in the first measurement state. It is not necessary to know the electrical resistance of the first and/or of the second measurement resistor for this purpose. Since the measurement resistors are arranged electrically in series, current fluctuations also have an impact on the voltage drops at both measurement resistors to the same extent such that the ratio of the electrical resistances of both measurement resistors can be determined even when current fluctuations arise.

In step b), the electrical resistance of the first measurement resistor is then determined in the second measurement state. In this measurement state, the reference resistor, the electrical resistance of which is known to a very accurate degree, is connected in parallel with the first resistor and the voltage drops at the first measurement resistor, at the second measurement resistor and also at the reference resistor are measured. The proportion of the current flowing across the reference resistor can be determined by way of the voltage drop detected at the reference resistor and also the known electrical resistance of the reference resistor. The current flowing through the current sensor flows entirely through the second measurement resistor and branches out into the current paths, arranged in series with the second measurement resistor, of the first measurement resistor and of the reference resistor arranged in parallel therewith. The current flowing through the second measurement resistor thus corresponds to the added currents through the first measurement resistor and the reference resistor. The electrical resistance of the first measurement resistor can be calculated from the previously identified ratio of the electrical resistances of the first and of the second measurement resistor, the measured voltage drops at the first and at the second measurement resistor and also the identified current across the reference resistor.

To determine the electrical resistance of the first measurement resistor, it is only necessary to identify the voltage drops at the measurement resistors and also at the reference resistor. Furthermore, the electrical resistance of the reference resistor and also the ratio of the electrical resistances of the first and of the second measurement resistor must be known. Knowledge of the electrical resistance of the first or of the second measurement resistor is not necessary.

Possibly present fluctuations in the load current during the second measurement state also arise at the second measurement resistor and can therefore be detected easily. Said fluctuations can therefore be taken into account in the determination of the electrical resistance of the first measurement resistor. Fluctuations in the load current can therefore be taken into account in the determination of the electrical resistance of the first measurement resistor, with the result that the electrical resistance of the first measurement resistor can be determined more accurately.

The following step is preferably carried out after step b):

c) in the first measurement state, identifying the voltage drop at the first measurement resistor and the voltage drop at the second measurement resistor and determining the ratio of the voltage drop at the first measurement resistor and the voltage drop at the second measurement resistor and determining the electrical resistance of the second measurement resistor from the identified voltage drops at the first measurement resistor and at the second measurement resistor and the electrical resistance of the second measurement resistor identified in step b).

If the electrical resistance of the first measurement resistor is known, the electrical resistance of the second measurement resistor can then be determined in a step c) in the first measurement state. To this end, in the second measurement state, the reference resistor is disconnected from the first measurement resistor, with the result that no current flows across the reference resistor. The current therefore flows entirely across the first measurement resistor and the second measurement resistor arranged in series therewith.

To determine the electrical resistance of the second measurement resistor, the voltage drop at the first measuring resistor is detected and the current intensity of the current is determined from the voltage drop and from the known electrical resistance of the first measurement resistor or the electrical resistance of the first measurement resistor identified in the first measurement state. Furthermore, the voltage drop across the second measurement resistor is identified. Since the current flowing across both measurement resistors must be the same due to the series circuit, the current flowing across the second measurement resistor is known. The electrical resistance of the second measurement resistor can therefore be determined from the current and the detected voltage drop.

Current fluctuations have an effect on the detection of the voltage drops in both measurement resistors on account of the series circuit of the measurement resistors. A change in current identified at the first measurement resistor can therefore be taken into account in the determination of the electrical resistance of the second measurement resistor.

The electrical resistances of the measurement resistors can be determined very accurately independently of current fluctuations by way of the method described above. The prerequisite is only that the ratio of the electrical resistances of the first and of the second measurement resistor identified in step a) is known and does not change during the determination of the electrical resistances of the measurement resistors.

In addition, in both measurement states, the current intensity of the current flowing through the current sensor is determined, with the result that interruption-free current measurement is ensured.

Steps b) and c) are preferably repeated in alternation, with the result that the two measurement resistors or the electrical resistances of the measurement resistors are balanced constantly. In particular, the electrical resistances of the measurement resistor can be determined more accurately by iteration owing to the alternating balancing.

Before step a), the electrical resistance of the first measurement resistor can optionally be determined.

The method can comprise the following steps for example in the first measurement state:

the current flowing across the first measurement resistor is determined from the voltage drop at the first measurement resistor and the electrical resistance of the first measurement resistor and/or the current flowing across the second measurement resistor is determined from the voltage drop at the second measurement resistor and the electrical resistance of the second measurement resistor and the load current flowing across the current sensor is identified from the current flowing across the first measurement resistor and/or the current flowing across the second measurement resistor.

The method can comprise the following steps in the second measurement state:

the current flowing across the first measurement resistor is determined from the voltage drop at the first measurement resistor and the electrical resistance of the first measurement resistor and/or the current flowing across the second measurement resistor is determined from the voltage drop at the second measurement resistor and the electrical resistance of the second measurement resistor, the current flowing across the reference resistor is determined from the voltage drop at the reference resistor and the electrical resistance of the reference resistor and the current flowing across the current sensor is identified from the current flowing across the second measurement resistor and/or from the added currents flowing across the first measurement resistor and the reference resistor.

The voltage drops at the first measurement resistor, at the second measurement resistor and at the reference resistor can each be detected by way of a voltage detection device. The voltage drops are thus detected directly.

However, it is also possible to identify individual voltage drops by way of calculation from measured voltage drops. For example, to identify the voltage drop at the second measurement resistor, the voltage drop at the first measurement resistor and also the voltage drop at the first measurement resistor and at the second measurement resistor, that is to say the total voltage drop across the current sensor, can be detected and the voltage drop at the second measurement resistor can be identified from the difference between the detected voltage drops.

In addition, the voltage drop between the first connection and the second connection can be detected in the first and/or in the second measurement state. The voltage drop between the first connection and the second connection can be used to balance the measured voltage drops across the first measurement resistor or the first measurement resistor and the reference resistor and the voltage drop across the second measurement resistor, with the result that the accuracy of the measurements, particularly in the case of low currents, can be improved.

Another aspect of the invention is a current sensor for measuring a battery current, in particular of a vehicle battery, having a first measurement resistor, a second measurement resistor and also a reference resistor. The first measurement resistor and the second measurement resistor are arranged in series between a first and a second connection of the current sensor. The reference resistor can be connected in parallel with the first measurement resistor. The current sensor also has a first voltage detection device for detecting the voltage drop across the first measurement resistor, a second voltage detection device for detecting the voltage drop across the second measurement resistor and a reference resistor voltage detection device for detecting the voltage drop across the reference resistor and also an evaluation circuit for determining the electrical resistance of the first and of the second measurement resistor by way of a method described above.

It should be mentioned that the order of the measurement resistor in the current direction or between the connections can be varied as desired. It is only necessary that a first and a second measurement resistor are connected in series and a reference resistor can be connected temporarily in parallel with one of the measurement resistors or can be disconnected therefrom and that the voltage drops at the resistors can be detected in each case individually, for example by way of a voltage detection device.

A switching element is preferably provided, which in a closed position produces the parallel circuit of the reference resistor with the first measurement resistor and in an open position disconnects the reference resistor from the first measurement resistor. The reference resistor can be connected in parallel with the first measurement resistor or can be disconnected therefrom in a simple manner by way of such a switching element.

The electrical resistances of the first measurement resistor and of the second measurement resistor are preferably substantially the same.

A third voltage detection device can optionally be provided to detect a voltage drop across the first measurement resistor and the second measurement resistor.

The measurement resistors can each be formed by a resistor element. However, it is also possible that the first measurement resistor and/or the second measurement resistor has at least two measurement resistor elements arranged in series and/or in parallel.

BRIEF DESCRIPTION OF THE DRAWINGS

Further advantages and features arise from the following description in connection with the appended drawings. In the drawings.

DETAILED DESCRIPTION OF THE PREFERRED EMBODIMENTS

Figure 1:
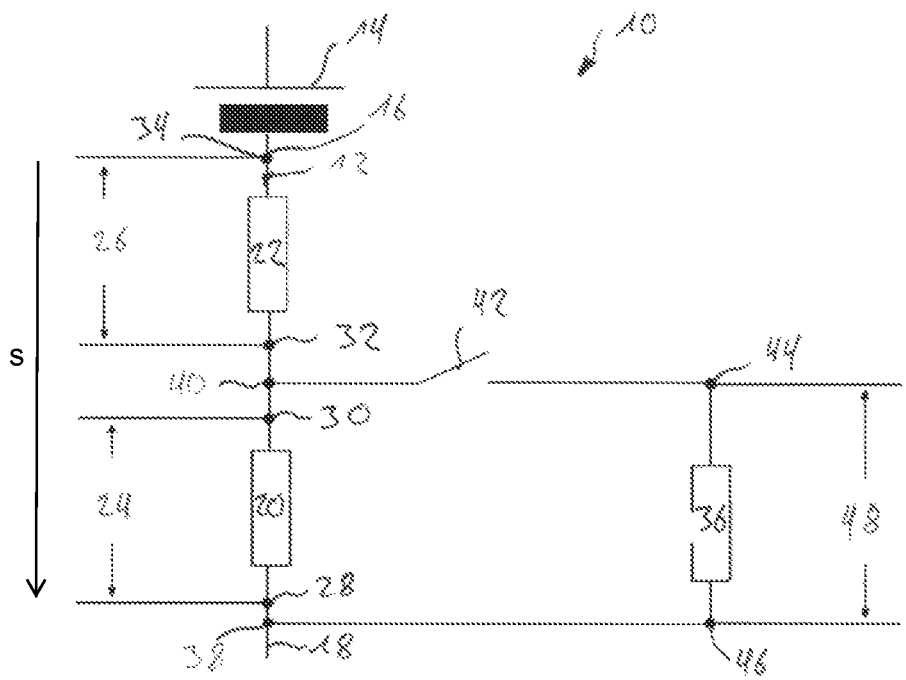
FIG. 1 shows a first embodiment of a current sensor according to an aspect of the invention.

FIG. 1 shows a current sensor 10 for determining the load current 12 at a vehicle battery 14. The current sensor 10 is used, for example, to determine the state of charge or the state of health of the vehicle battery 14.

The current sensor 10 has a first connection 16, which can be contact-connected to the vehicle battery, and also a second connection 18, which is contact-connected, for example, to the vehicle body or to a ground. The current sensor 10 is connected to the vehicle battery 14 such that the total load current flows across the current sensor 10 and therefore can be detected by the current sensor.

The current sensor 10 has a first measurement resistor 20 and a second measurement resistor 22, which are arranged in series between the first connection 16 and the second connection 18. Furthermore, two voltage detection devices 24, 26 are provided, which are each electrically contact-connected to the measurement resistors 20, 22 by way of a connection point 28, 30, 32, 34 upstream and downstream of said measurement resistors. The first voltage detection device 24 can therefore detect a voltage drop across the first measurement resistor 20, the second voltage detection device 26 can detect a voltage drop across the second measurement resistor 22.

Furthermore, a reference resistor 36 is provided, which can be connected in parallel with the first measurement resistor 20 via two connection points 38, 40. The reference resistor 36 is a highly accurate resistor, which consists of a material that does not exhibit a change or only exhibits a very small change in the electrical resistance on account of temperature, external influences or aging.

A switching element 42 is provided at the reference resistor 36 in order to complete or to interrupt the connection between the reference resistor 36 and the connection point 40. The reference resistor 36 can thus be connected in parallel with the first measurement resistor 20 or disconnected therefrom by means of the switching element 42.

Furthermore, a reference resistor voltage detection device 48 connected via connection points 44, 46 is provided at the reference resistor 36 to detect a voltage drop across the reference resistor 36.

If a load current 12 flows across the current sensor 10, the voltage drops across the first and the second measurement resistor 20, 22 are detected and the current intensity of the load current 12 flowing across the current sensor 10 is determined from the detected voltage drops and the electrical resistances of the measurement resistors 20, 22 by means of Ohm's law.

However, the electrical resistance of the measurement resistors 20, 22 can change on account of temperature changes, external influences or by aging. It is therefore necessary to determine the electrical resistances of the measurement resistors 20, 22 or correction factors for correcting the electrical resistances of the measurement resistors 20, 22 during operation of the current sensor 10.

This takes place by way of the method described in detail below.

First, the switching element 42 is open in a first switching state, with the result that the reference resistor 36 is disconnected from the first measurement resistor 20. In this state, the load current 12 flowing across the current sensor 10 can be determined in the manner described above. The ratio of the electrical resistances R1, R2 of the first measurement resistor 20 and of the second measurement resistor 22 can be calculated from the measured voltage drops at the measurement resistors 20, 22.

The following holds true $$a=R1/R2=U2/U1$$

Subsequently, in a second measurement state, the switching element 42 is closed, with the result that the reference resistor 36 is connected in parallel with the first measurement resistor 20.

To determine the electrical resistance of the first measurement resistor 20, the voltage drop across the second measurement resistor is detected by way of the second voltage detection device 26. Furthermore, at the same time, the voltage drop across the first measurement resistor 20 is detected by way of the first voltage detection device 24. At the same time, the voltage drop at the reference resistor 36 is detected by means of the reference resistor voltage detection device 48. The current intensity Iref of the current flowing across the reference resistor 36 can be determined from the detected voltage drop across the reference resistor 36 and the known electrical resistance of the reference resistor.

In the second measurement state, the total load current 12 flows across the second measurement resistor 22. On account of the parallel circuit of the first measurement resistor 20 and the reference resistor 36, the load current branches out into the two current paths across the first measurement resistor 20 and the reference resistor 36.

The following thus holds true:

$$I=I2=I1+Iref$$

$$I2=U2/R2 \text{ and } a=U2/U1 \text{ results in}$$

$$I=U2/R2=a*U2/R1$$

and $$a*U2/R1=U1/R1+Iref$$

and $$R1=(a*U2-U1)/Iref$$

It is thus not necessary to know the electrical resistance of the first or of the second measurement resistor 20, 22. It is only necessary to know the previously identified ratio of the electrical resistances and the electrical resistance of the reference resistor 36 and to measure the voltage drops at the measurement resistors 20, 22 and also at the reference resistor 36.

If the electrical resistance of the first measurement resistor 20 is determined, the switching element 42 is opened in the first measurement state, that is to say the reference resistor 36 is disconnected from the first measurement resistor 20. The load current therefore flows exclusively across the first measurement resistor 20 and the second measurement resistor 22.

The voltage drop across the first measurement resistor 20 is then detected by means of the voltage detection device 24 and the current intensity of the load current 12 is determined from the voltage drop and also the previously determined electrical resistance of the first measurement resistor 20.

Furthermore, the voltage drop across the second measurement resistor 22 is detected by way of the second voltage detection device 26. Since the measurement resistors 20, 22 are arranged in series, the current intensity of the current flowing across the second measurement resistor 22 corresponds to the current intensity of the current flowing across the first measurement resistor 20. The electrical resistance of the second measurement resistor 22 can therefore be determined by means of Ohm's law from the detected voltage drop across the second measurement resistor 22 and also the current intensity determined from the voltage drop across the first measurement resistor 20.

The first measurement state and the second measurement state are preferably carried out in alternation, with the result that the electrical resistances of the first measurement resistor 20 and of the second measurement resistor 22 are balanced continuously. In particular, the electrical resistances of the measurement resistors 20, 22 can be iteratively determined more accurately owing to the constant balancing.

The advantage of the method described above is that the total load current or the profile thereof is determined permanently, with the result that fluctuations in the load current can be taken into account in the determination of the electrical resistances of the measurement resistors 20, 22.

Furthermore, the load current is constantly determined from the voltage drop at the first and/or at the second measurement resistor 20, 22. The load current is thus detected in an interruption-free manner and at the same time the electrical resistances of the measurement resistors 20, 22 are balanced continuously.

Figure 2:
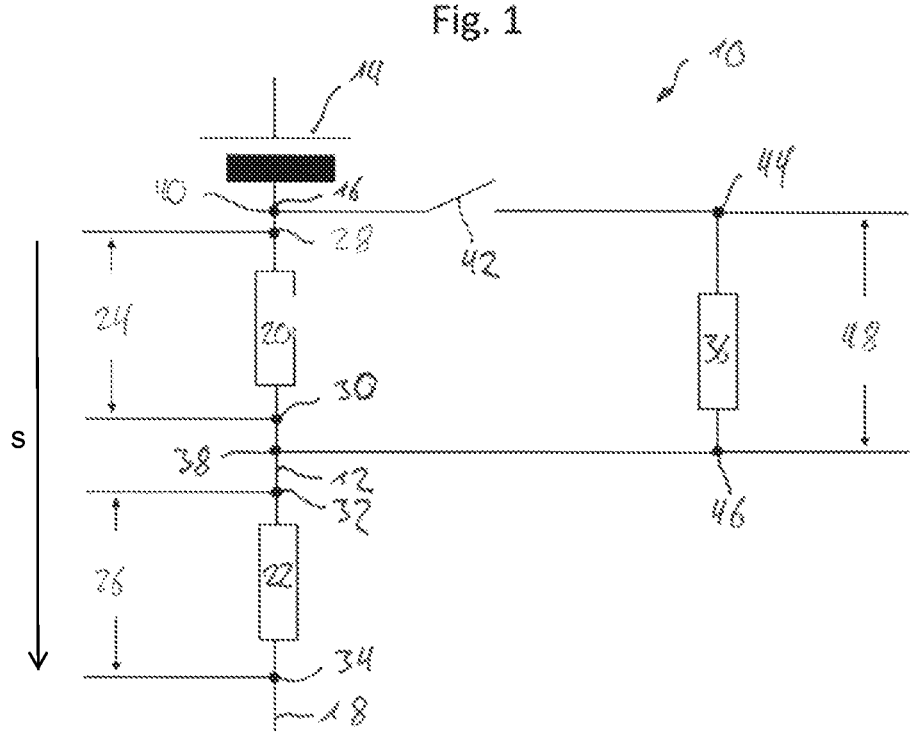
FIG. 2 shows a second embodiment of a current sensor according to an aspect of the invention.

For the method described above, the position of the first measurement resistor 20, to which the reference resistor 36 can be connected in parallel, in the current direction is insignificant. The first measurement resistor 20 can be the measurement resistor that is at the rear with respect to the current direction S, as illustrated in FIG. 1. However, the first measurement resistor 20 can also be the measurement resistor that is at the front with respect to the current direction S, as illustrated in FIG. 2.

Figure 3:
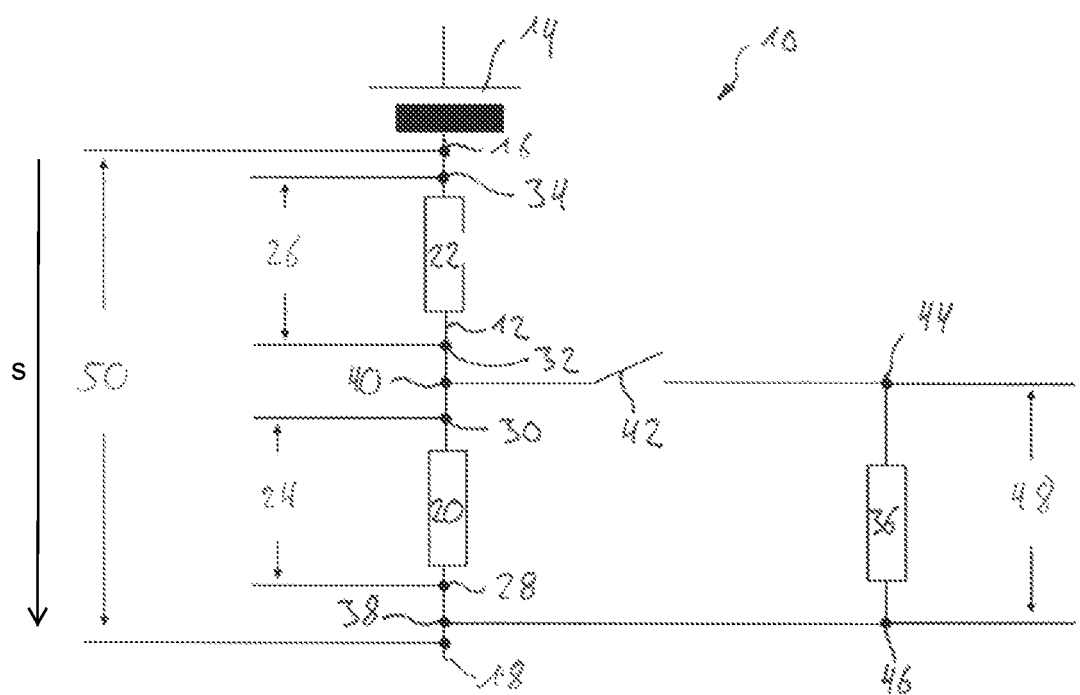
FIG. 3 shows a third embodiment of a current sensor according to an aspect of the invention.

The current sensor illustrated in FIG. 3 differs from the current sensor illustrated in FIG. 1 only by way of an additional voltage detection device 50, which detects the voltage drop between the first connection 16 and the second connection 18, that is to say the total voltage drop across the current sensor.

Said voltage drop can be used for balancing with the voltage drops described above or for improving the determination of the current intensities at the individual measurement resistors 20, 22 or the reference resistor 36, and therefore can be used for more accurate determination of the electrical resistances of the measurement resistors 20, 22.

The electrical resistances of the measurement resistors 20, 22 are preferably substantially the same. However, they can also be different from one another.

The switching element 42 can be formed by any desired electrical components. As an alternative, the switching element 42 can interrupt or complete the connection to the connection 38. There may also be two switching elements 42 provided, which disconnect the reference resistor 36 completely from the current path.

The method described above is usually executed by way of a control system, in which the electrical resistances of the measurement resistors 20, 22 and of the reference resistor 36 are stored and which controls the two measurement states described above.

LIST OF REFERENCE SIGNS

10 Current sensor
12 Load current
14 Vehicle battery
16 First connection
18 Second connection
20 First measurement resistor
22 Second measurement resistor
24 First voltage detection device
26 Second voltage detection device
28 Connection point
30 Connection point
32 Connection point
34 Connection point
36 Reference resistor
38 Connection point
40 Connection point
42 Switching element
44 Connection point
46 Connection point
48 Reference resistor voltage detection device
50 Third voltage detection device

The invention claimed is:

1. A method for operating a current sensor, which has a first measurement resistor, a second measurement resistor and also a reference resistor, wherein the first measurement resistor and the second measurement resistor are arranged in series between a first connection and a second connection of the current sensor, and wherein the reference resistor is electrically disconnected from the first measurement resistor and from the second measurement resistor in a first measurement state and the reference resistor is electrically connected in parallel with the first measurement resistor in a second measurement state, the method comprising:

a) in the first measurement state, identifying a voltage drop at the first measurement resistor and a voltage drop at the second measurement resistor and determining a ratio of the voltage drop at the first measurement resistor and the voltage drop at the second measurement resistor, b) in the second measurement state, identifying the voltage drop at the first measurement resistor, the voltage drop at the second measurement resistor and also a voltage drop at the reference resistor and determining an electrical resistance of the first measurement resistor and determining an electrical resistance of the second measurement resistor from the identified voltage drops, an electrical resistance of the reference resistor and the ratio of the voltage drops of the first measurement resistor and the second measurement resistor determined in the first measurement state.

2. The method as claimed in claim 1, further comprising out after step b):

c) in the first measurement state, identifying the voltage drop at the first measurement resistor and the voltage drop at the second measurement resistor and determining the ratio of the voltage drop at the first measurement resistor and the voltage drop at the second measurement resistor and determining the electrical resistance of the second measurement resistor from the identified voltage drops at the first measurement resistor and at the second measurement resistor and the electrical resistance of the second measurement resistor identified in step b).

3. The method as claimed in claim 2, wherein steps b) and c) are carried out repeatedly in alternation.

4. The method as claimed in claim 1, wherein an initial electrical resistance of the first measurement resistor is determined before step a).

5. The method as claimed in claim 1, wherein, in the first measurement state:

a current flowing across the first measurement resistor is determined from the voltage drop at the first measurement resistor and the electrical resistance of the first measurement resistor and/or a current flowing across the second measurement resistor is determined from the voltage drop at the second measurement resistor and the electrical resistance of the second measurement resistor and a load current flowing across the current sensor is identified from the current flowing across the first measurement resistor and/or the current flowing across the second measurement resistor.

6. The method as claimed in claim 1, wherein, in the second measurement state:

a current flowing across the first measurement resistor is determined from the voltage drop at the first measurement resistor and the electrical resistance of the first measurement resistor and/or a current flowing across the second measurement resistor is determined from the voltage drop at the second measurement resistor and the electrical resistance of the second measurement resistor, a current flowing across the reference resistor is determined from the voltage drop at the reference resistor and the electrical resistance of the reference resistor, and a current flowing across the current sensor is identified from the current flowing across the second measurement resistor and/or from the added currents flowing across the first measurement resistor and the reference resistor.

7. The method as claimed in claim 1, wherein the voltage drops at the first measurement resistor, at the second measurement resistor and at the reference resistor are each detected by way of a voltage detection device.

8. The method as claimed in claim 1, wherein, to identify the voltage drop at the second measurement resistor, the voltage drop at the first measurement resistor is detected, and the voltage drop at the first and second measurement resistors are detected and then the voltage drop at the second measurement resistor is identified from the difference between the detected voltage drops.

9. A current sensor for measuring a battery current comprising a first measurement resistor, a second measurement resistor and a reference resistor, wherein the first measurement resistor and the second measurement resistor are arranged in series between a first connection and a second connection of the current sensor, and wherein the reference resistor is electrically disconnected from the first measurement resistor and from the second measurement resistor in a first measurement state and the reference resistor is electrically connected in parallel with the first measurement resistor in a second measurement state, having voltage detection devices for identifying the voltage drops at the first measurement resistor, at the second measurement resistor and at the reference resistor, and having a control system for determining the electrical resistance of the first measurement resistor and the second measurement resistor by:

a) in the first measurement state, identifying a voltage drop at the first measurement resistor and a voltage drop at the second measurement resistor and determining a ratio of the voltage drop at the first measurement resistor and the voltage drop at the second measurement resistor, b) in the second measurement state, identifying the voltage drop at the first measurement resistor, the voltage drop at the second measurement resistor and also a voltage drop at the reference resistor and determining an electrical resistance of the first measurement resistor and determining an electrical resistance of the second measurement resistor from the identified voltage drops, an electrical resistance of the reference resistor and the ratio of the voltage drops of the first measurement resistor and the second measurement resistor determined in the first measurement state.

10. The current sensor as claimed in claim 9, wherein a switching element is provided, said switching element in a closed position producing the parallel circuit of the reference resistor with the first measurement resistor.

11. The current sensor as claimed in claim 9, wherein a first voltage detection device is provided to detect a voltage drop at the first measurement resistor and/or a second voltage detection device is provided to detect a voltage drop at the second measurement resistor, and wherein a reference current voltage detection device is provided to detect a voltage drop at the reference resistor.

12. The current sensor as claimed in claim 9, wherein a third voltage detection device is provided to detect a voltage drop across the first measurement resistor and the second measurement resistor.

13. The current sensor as claimed in claim, 9, wherein the electrical resistances of the first measurement resistor and of the second measurement resistor are substantially the same.

14. The current sensor as claimed in one of claim 10, wherein a first voltage detection device is provided to detect a voltage drop at the first measurement resistor and/or a second voltage detection device is provided to detect a voltage drop at the second measurement resistor, and wherein a reference current voltage detection device is provided to detect a voltage drop at the reference resistor.

* * * * *